United States Patent [19]

Koike

[11] Patent Number: 4,591,744

[45] Date of Patent: May 27, 1986

[54] TRANSITION DETECTION CIRCUIT

[75] Inventor: Hideharu Koike, Yokohama, Japan

[73] Assignee: Tokyo Shibaura Denki Kabushiki Kaisha, Kawasaki, Japan

[21] Appl. No.: 577,763

[22] Filed: Feb. 7, 1984

[30] Foreign Application Priority Data

Feb. 14, 1983 [JP] Japan ................................. 58-22510

[51] Int. Cl.[4] ..................... G01R 19/00; H03K 5/153; H03K 19/094; H03K 19/21
[52] U.S. Cl. ................................. 307/518; 307/440; 307/448
[58] Field of Search ............... 307/440, 445, 448, 450, 307/451, 279, 350, 517, 518, 584, 585

[56] References Cited

U.S. PATENT DOCUMENTS

| | | | |
|---|---|---|---|
| 3,942,037 | 3/1976 | Mensch, Jr. | 307/518 |
| 3,976,949 | 8/1976 | Hepworth et al. | 307/448 X |
| 4,039,858 | 8/1977 | Stewart | 307/231 |
| 4,061,975 | 12/1977 | Sugai | 307/445 X |
| 4,349,754 | 9/1982 | Bull | 307/517 X |
| 4,518,872 | 5/1985 | Backes | 307/448 |
| 4,524,291 | 6/1985 | Lehning | 307/517 X |

OTHER PUBLICATIONS

Millman et al., "Pulse, Digital and Switching Waveforms"; pp. 328–330; 1965 by McGraw-Hill, Inc.

Primary Examiner—Larry N. Anagnos
Attorney, Agent, or Firm—Schwartz, Jeffery, Schwaab, Mack, Blumenthal & Evans

[57] ABSTRACT

A transition detection circuit comprises an inverter circuit for inverting an input signal, an S-R flip-flop circuit receiving the input signal at one of its input terminals and the inverted input signal at the other input terminal, and having a time difference between the transitions of the signals at the output terminals; and a coincidence detection circuit receiving the output signals from the output terminals of the flip-flop circuit and generating a coincidence detection signal when the output signals are both at the same and specific logic level. The coincidence detection signal serves to represent a transition of logic level of the input signal.

10 Claims, 8 Drawing Figures

TRANSITION DETECTION CIRCUIT

BACKGROUND OF THE INVENTION

This invention relates to a transition detection circuit for detecting a change or transition of the logic level of a signal in a digital circuit.

Conventional transition detection circuits are exemplified by those shown in FIGS. 1 and 2. The transition detection circuit shown in FIG. 1 comprises four serially connected inverters 1, 2, 3, 4, N-channel MOS transistors 40, 50, 70, 80, and a resistor 60. The outputs of the first and fourth stage inverters 1 and 4 are respectively input to the gates of the N-channel MOS transistors 40, 50, while an input signal A itself and the output of the third inverter 3 are respectively input to the gates of the N-channel MOS transistors 70, 80. A NAND gate comprising the N-channel MOS transistors 70, 80 detects a transition of the logic level of the input signal A from the low level (L) to the high level (H), and another NAND gate comprising the N-channel MOS transistors 40, 50 detects a transition from the high level (H) to the low level (L).

The transition detection circuit as described above, however, has problems in that many elements and connections are required and hence the pattern area needed to form the circuit is extensive.

The transition detection circuit shown in FIG. 2 comprises three inverters 5, 6, 7, N-channel MOS transistors 40, 50, and a resistor 60. The threshold value $V_{TH1}$ of the inverter 5 and the threshold value $V_{TH2}$ of the inverter 6 are set at different values from each other. The output of the inverter 5 and the inverted output of the inverter 6 are respectively input to the gates of the N-channel MOS transistors 40, 50 which constitute a NAND gate. By virtue of the difference of the threshold values $V_{TH1}$ and $V_{TH2}$, the transition of the logic level of the input signal A can be detected.

This transition detection circuit can be fabricated with less circuit connections. But it has drawbacks in that adjustment of the threshold values $V_{TH1}$, $V_{TH2}$ is difficult. Moreover, as the rate of change of the input signal increases, the pulse width of a coincidence detection signal becomes narrower which makes it difficult to achieve a stable detection of the transition.

SUMMARY OF THE INVENTION

It is an object of the present invention to provide a transition detection circuit capable of stably detecting the transition, with lesser circuit connections and relatively simple construction.

According to the invention, there is provided a transition detection circuit comprising:

an inverter circuit for inverting an input signal and outputting an inverted input signal;

an S-R flip-flop circuit having two input terminals and two output terminals, receiving said input signal at one of said input terminals and said inverted input signal at the other of said input terminals, and having a time difference between the transitions of the signals at said two output terminals; and a coincidence detection circuit receiving the output signals from said output terminals of said flip-flop circuit and generating a coincidence detection signal when said output signals are both at the same and specific logic level;

whereby said coincidence detection signal serves to represent a transition of logic level of said input signal.

DETAILED DESCRIPTION OF THE PREFERRED EMBODIMENTS

The present invention will now be described with reference to the embodiments specifically shown in the respective figures.

Figure 1:
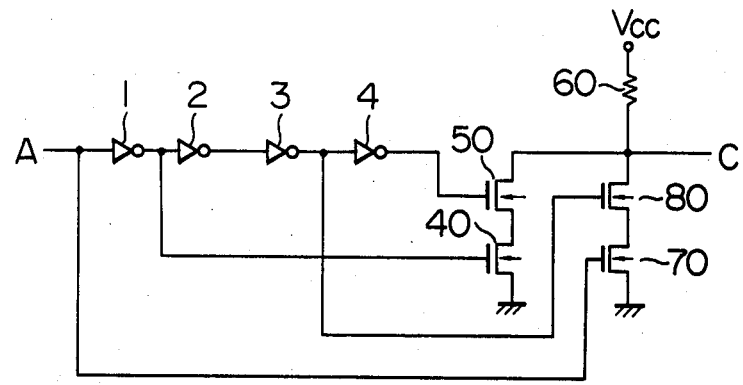
FIG. 1 is a circuit diagram of a prior art transition detection circuit.
Figure 2:
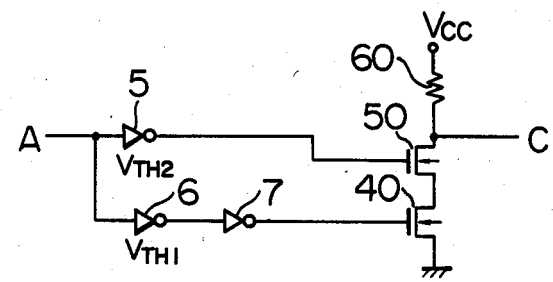
FIG. 2 is a circuit diagram of a prior art transition detection circuit.
Figure 3:
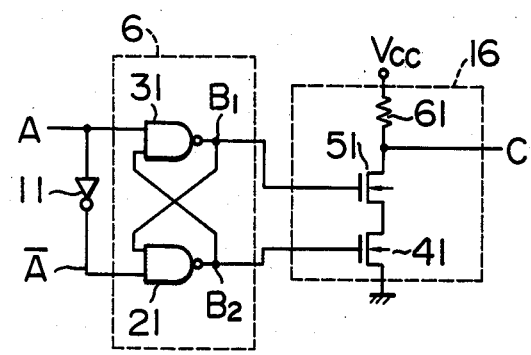
FIG. 3 is a circuit diagram of a transition detection circuit according to a first embodiment of the present invention.

The transition detection circuit according to the first embodiment of the present invention comprises, as shown in FIG. 3, an inverter 11, a logic gate such as an S-R flip-flop 6 formed of NAND gates 21, 31, and a coincidence detection circuit in the form of a two-input NAND gate formed of N-channel MOS transistors 41, 51 and a resistor 61. The S-R flip-flop is supplied at its set input terminal with an input signal A, and is supplied at its reset input terminal with an inverted input signal $\overline{A}$ which has been derived by inverting the input signal A by the inverter 11. The gates of the N-channel MOS transistors 41, 51 are supplied with the output signals $B_1$, $B_2$ of the S-R flip-flop, respectively.

The operation of the circuit will be described with reference to FIG. 4. As the logic level of the input signal A transits from a high level to the low level, the output signal $B_1$ of the NAND gate 31 rises with some delay from a low level to the high level. The output signal $B_1$ as well as the inverted input signal $\overline{A}$ is input to the NAND gate 21, causing the output signal $B_2$ of the NAND gate 21 to change from a high level to the low level. As particularly shown in FIG. 4, owing to the delay in operation of the NAND circuit 21, the change of the output signal $B_2$ lags by a certain time behind that of the output signal $B_1$. As a result, logic signals are both at a high level for a certain time interval. Thus, the N-channel MOS transistors 41, 51 are concurrently rendered conductive, thereby outputting a pulsative detection signal which is at a "0" level when a transition is detected.

Contrary to the above, as the logic level of the input signal A transits from a low level to the high level, the output signal $B_2$ rises, and in turn the output signal $B_1$ changes from a high level to the low level with a delay time in operation of the NAND circuit 31. Therefore, as shown in FIG. 4, a time difference between the transitions of the output signals $B_1$, $B_2$ appears so that output signals $B_1$, $B_2$ are both at a high level for a certain time interval. Thus, the N-channel MOS transistors 41, 51 are concurrently rendered conductive to thereby output a pulsative detection signal.

As seen from the above description of the embodiment, it will be understood that the transitions in both directions of an input signal can be detected with a simple circuit arrangement.

Figure 5:
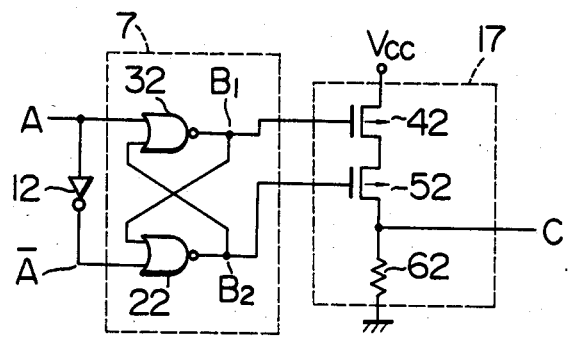
FIG. 5 is a circuit diagram of a transition detection circuit according to a second embodiment of the present invention.
Figure 6:
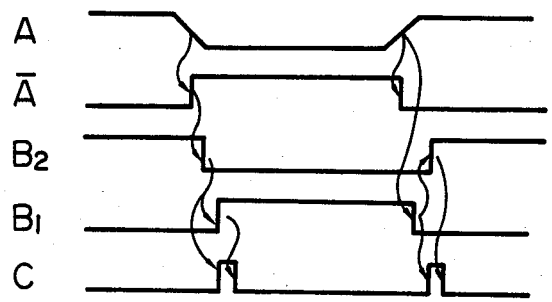
FIG. 6 is a timing chart illustrating the operation of the circuit shown in FIG. 5.

Referring further to FIGS. 5 and 6, a transition detection circuit according to the second embodiment of the present invention will be discussed. In this embodiment, an S-R flip-flop 7 is formed of NOR gates 22, 32, while a two-input NOR gate 17 serving as a coincidence detection circuit is formed of P-channel MOS transistors 42, 52. As shown in FIG. 6, in response to the change of the input signal A from a high level to the low level, the inverted input signal $\overline{A}$ is also changed from a low level to the high level, causing the output signal $B_2$ of the S-R flip-flop to fall. The fall of the output signal $B_2$ makes the output signal $B_1$ change from a low level to the high level. However, by virtue of the delay in operation of the NOR circuit 32, the change of the output signal $B_1$ lags by a certain time so that a time difference of the transitions between the output signals $B_1$, $B_2$ appears so that both P-channel MOS transistors 42, 52 are concurrently rendered conductive for a certain time interval. Thus, a detection signal C is generated which takes a "1" level when a transition is detected. Similarly to the above, in the case of the change of the input signal A from a low level to the high level, a detection signal C can be generated because of the presence of the delay in operation of the NOR circuit 22, thus making it possible to detect the transition in a opposite direction of the input signal A.

Figure 4:
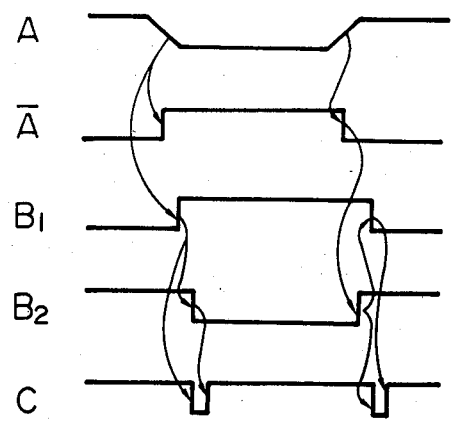
FIG. 4 is a timing chart illustrating the operation of the circuit shown in FIG. 3.

As particularly shown in FIGS. 4 and 6, the pulse width of the detection signal C is determined by the time delay in operation of either the NAND circuits 21, 31, or the NOR circuits 22, 32. Thus, the pulse width is kept constant irrespective of the rising/falling rate or transition rate of the input signal A. The operation of the transition detection circuit of the first or second embodiment is therefore stable.

Figure 7:
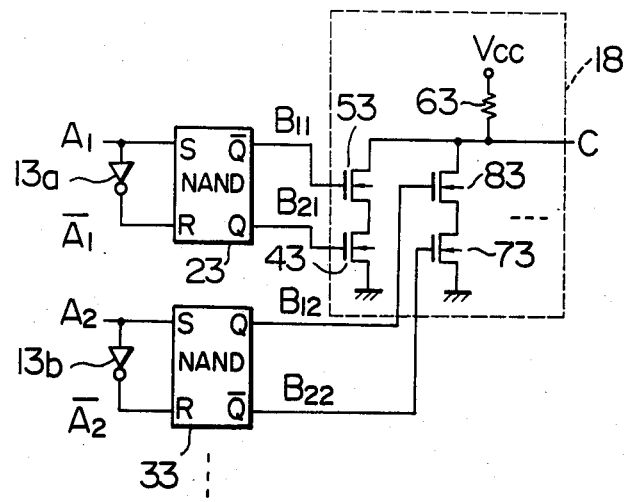
FIG. 7 is a circuit diagram of a transition detection circuit according to a third embodiment of the present invention.

Next, a still further transition detection circuit according to the third embodiment of the present invention will be described with reference to FIG. 7. The transition detection circuit of this embodiment is for detecting the transition caused in any one of a plurality of input signals $A_1$, $A_2$, . . . The circuit comprises inverters 13a, 13b, . . . , S-R flip-flops 23, 33, . . . , and a coincidence detection circuit 18. The inverters 13a, 13b, . . . are provided in association with respective input signals $A_1$, $A_2$, . . . for producing inverted input signals $\overline{A}_1$, $\overline{A}_2$, . . . . The S-R flip-flops 23, 33, . . . are formed of NAND gates similarly as those shown in FIG. 3. The coincidence detection circuit 18 is constructed of a wired-OR circuit. The wired-OR circuit or coincidence detection circuit 18 comprises series circuits provided in association with the respective flip-flops 23, 33, . . . . Each of the series circuits has serially connected switching elements which receive at the respective control input terminals thereof the outputs from the associated flip-flops 23, 33, . . . . The switching elements, in this embodiment, are N-channel MOS transistors 43, 53, 73, 83, . . . . The series circuits are connected in parallel with each other, that is their outputs are commonly coupled. With this circuit configuration, a pulse is generated on a detection terminal C when a transition occurs in any one of the input signals $A_1$, $A_2$, . . . .

Figure 8:
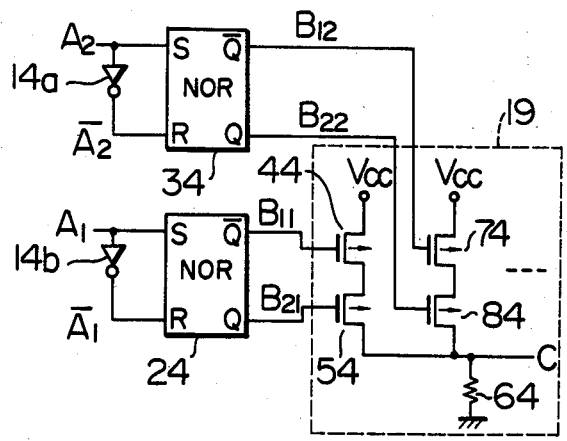
FIG. 8 is a circuit diagram of a transition detection circuit according to a fourth embodiment of the present invention.

The transition detection circuit shown in FIG. 8 is generally similar to that shown in FIG. 7, except as noted below. In FIG. 8, S-R flip-flops 24, 34, . . . are of the same construction as the flip-flops 7 in FIG. 5, that is, the flip-flops 24, 34, . . . are formed of NOR gates. In addition, a coincidence detection circuit 19 is formed of P-channel MOS transistors 44, 54, 74, 84, . . . .

The coincidence circuits described above have been described as being formed of NAND or NOR gates, however, it is not limited thereto, but any other type of coincidence detection circuits can be used as far as an output signal is generated therefrom when the two output signals of the flip-flop assume the same and specific logic level. Moreover, if the inherent delay in operation of the NAND circuits 21, 31, or the NOR circuits 22, 32 is not long enough, the output terminals of the NAND or NOR circuits may be grounded through appropriate capacitors to increase the delay.

As seen from the above, according to the present invention, the transition detection circuit can be embodied with a simple construction and it requires only a small pattern area. Furthermore, since the pulse width of the coincidence detection signal is determined independent of the rate of change of the input signals, the circuit operation is stable. In addition, even if plural input signals for the circuit are employed, the transition detection circuit can be realized with a simple construction.

What is claimed is:

1. A transition detection circuit comprising:
an inverter circuit for inverting an input signal and outputting an inverted input signal;
an S-R flip-flop circuit having two input terminals and two output terminals, receiving said input signal at one of said input terminals and said inverted input signal at the other of said input terminals, and having a time difference between the transitions of the signals at said two output terminals; and
a coincidence detection circuit receiving the output signals from said output terminals of said flip-flop circuit and generating a coincidence detection signal when said output signals are both at the same and specific logic level;
wherein said coincidence detection signal serves to represent a logic level transition of said input signal.

2. A transition detection circuit as set forth in claim 1, wherein
said flip-flop circuit comprises a pair of logic gates, a first one of said logic gates receiving at one of the input terminals thereof said input signal and receiving at the other of the input terminals thereof an output from a second one of said logic gates, said second logic gate receiving at one of the input terminals thereof said inverted input signal and receiving at the other of the input terminals thereof an output from said first logic gate, and said outputs of both logic gates serving as the outputs of said flip-flop circuit; and
wherein said logic gates have a delay between the transition of the input signal and the transition of the output signal, causing a time difference of the transitions between said outputs of said flip-flop circuit.

3. A transition detection circuit as set forth in claim 2, wherein said logic gates are NAND gates, and said coincidence detection circuit comprises a NAND gate which receives as inputs thereto said two outputs from said flip-flop circuit, the value "0" of the output of said NAND gate being indicative of an occurrence of the transition.

4. A transition detection circuit as set forth in claim 2, wherein said logic gates are NOR gates, and said coincidence detection circuit comprises a NOR gate which receives as inputs thereto said two outputs from said flip-flop circuit, the value "1" of the output of said NOR gate being indicative of an occurrence of the transition.

5. A transition detection circuit as set forth in claim 1, wherein said output terminals of said flip-flop circuit are directly connected to said coincidence detection circuit.

6. A transition detection circuit for detecting an occurrence of a transition in any one of a plurality of input signals comprising:
a plurality of inverter circuits respectively provided in association with said input signals, each of said inverter circuits receiving and inverting the associated input signal and outputting an inverted signal;
a plurality of S-R flip-flop circuits provided in association with said input signals, each of said S-R flip-flop circuits having two input terminals and two output terminals, receiving at, one of said input terminals, the associated input signal and, at the other of said input terminals, the inverted input signal derived from the associated input signal, and having a time difference between the transitions of the signals at said two output terminals; and
a coincidence detection circuit comprising a parallel connection of series circuits each including serially connected switching elements, said series circuits being provided in association with said flip-flop circuits, and said switching elements receiving, at respective control input terminals thereof, the output signals from said output terminals of the associated flip-flop circuit;
wherein the output of said coincidence detection circuit indicates an occurrence of the transition of logic level in any one of said input signals.

7. A transition detection circuit as set forth in claim 6, wherein
each of said flip-flop circuits comprises a pair of logic gates, a first one of said logic gates receiving at one of the input terminals thereof the associated input signal and receiving at the other of the input terminals thereof an output from a second one of said logic gates, said second logic gate receiving at one of the input terminals thereof the inverted input signal derived from the associated input signal and receiving at the other of the input terminals thereof an output from said first logic gate, said outputs of both logic gates serving as the outputs of each one of said flip-flop circuits; and
wherein said logic gates have a delay between the transition of the input signal and the transition of the output signal, causing a time difference of the transitions between said outputs of each of said flip-flop circuits.

8. A transition detection circuit as set forth in claim 7, wherein said logic gates are NAND gates, and said switching elements are N-channel MOS FETs.

9. A transition detection circuit as set forth in claim 7, wherein said logic gates are NOR gates, and said switching elements are P-channel MOS FETs.

10. A transition detection circuit as set forth in claim 6, wherein said output terminals of each of the flip-flop circuits are directly connected to the control input terminals of the associated switching elements of said coincidence detection circuit.

* * * * *